United States Patent [19]
Lascelles et al.

[11] Patent Number: 5,070,534
[45] Date of Patent: Dec. 3, 1991

[54] SIMPLIFIED CAD PARAMETRIC MACROINSTRUCTION CAPABILITY INCLUDING VARIATIONAL GEOMETRICS FEATURE

[75] Inventors: Martin C. Lascelles, Boulder; Michael Wong, Longmont, both of Colo.

[73] Assignee: International Business Machines Corporation, Armonk, N.Y.

[21] Appl. No.: 258,965

[22] Filed: Oct. 17, 1988

[51] Int. Cl.$^5$ ............................................. G06F 15/00
[52] U.S. Cl. ................................... 395/155; 395/141
[58] Field of Search ... 364/200 MS File, 900 MS File, 364/518, 521, 522, 513, 516; 340/709–712, 744, 748, 750

[56] References Cited

U.S. PATENT DOCUMENTS

| | | | |
|---|---|---|---|
| 4,439,761 | 3/1984 | Fleming et al. | 340/735 |
| 4,622,546 | 11/1986 | Sfarti et al. | 340/748 |
| 4,656,603 | 4/1987 | Dunn | 364/900 |
| 4,672,575 | 6/1987 | Stephens | 364/900 |
| 4,686,522 | 8/1987 | Hernandez et al. | 340/709 |
| 4,698,625 | 10/1987 | McCaskill et al. | 340/709 |
| 4,710,885 | 12/1987 | Litteken | 364/518 |
| 4,751,674 | 6/1988 | Aoyagi et al. | 364/900 |
| 4,786,895 | 11/1988 | Castaneda | 340/709 |
| 4,809,201 | 2/1989 | Keklak | 364/518 |
| 4,811,240 | 3/1989 | Ballou et al. | 364/521 |
| 4,813,013 | 3/1989 | Dunn | 364/521 |
| 4,829,446 | 5/1989 | Draney | 364/518 |
| 4,849,911 | 7/1989 | Campian | 364/521 |
| 4,862,390 | 8/1989 | Weiner | 364/521 |
| 4,864,520 | 9/1989 | Setoguchi et al. | 364/522 |
| 4,868,766 | 9/1989 | Oosterholt | 364/522 |
| 4,901,250 | 2/1990 | Ishida et al. | 364/521 |
| 4,903,012 | 2/1990 | Ohuchi | 340/709 |
| 4,924,409 | 5/1990 | Fukunaga | 364/518 |
| 4,931,957 | 6/1990 | Takagi et al. | 364/518 |

*Primary Examiner*—Stuart N. Hecker
*Assistant Examiner*—Rebecca L. Rudolph
*Attorney, Agent, or Firm*—Carl M. Wright

[57] ABSTRACT

Macroinstructions for computer-aided design systems can be designed by the user without special language or syntax using the systems' menu-driven instruction set. Macroinstructions can be nested. The designer constructs patterns and the steps are recorded. Parameters can be selectively included in the macroinstructions or can be supplied at the time the macroinstructions are played. The designer can also create geometrics by storing a routine that will automatically draw dependent figures by supplying the dependent parameters to maintain given relationships between the dependent and independent figures according to the parameters supplied for the independent figure.

8 Claims, 3 Drawing Sheets

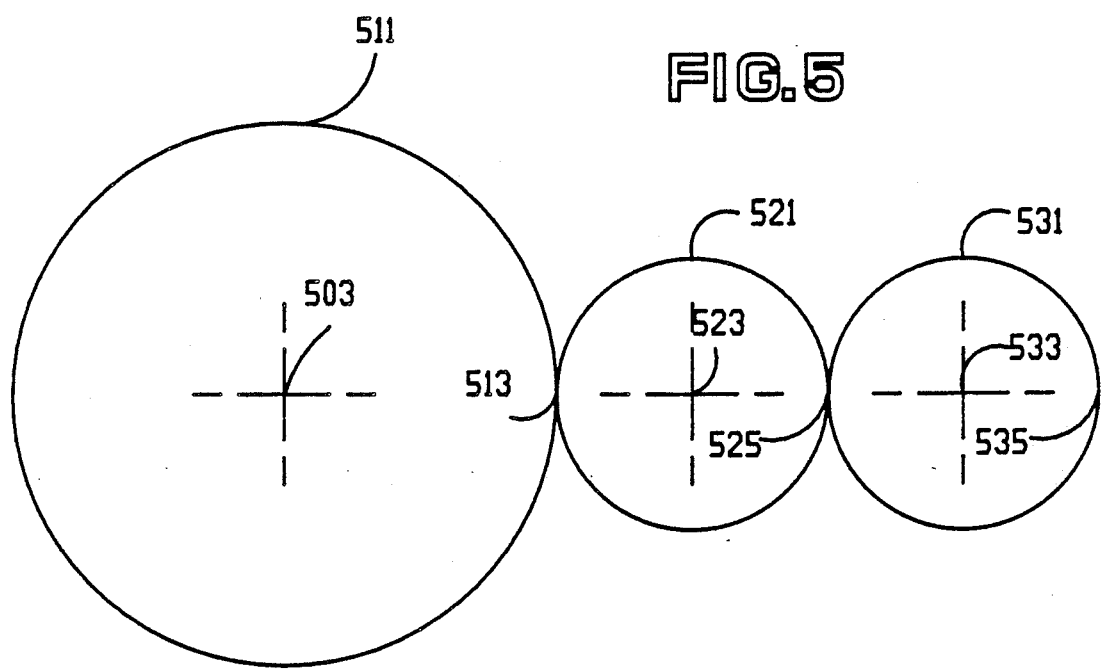

SIMPLIFIED CAD PARAMETRIC MACROINSTRUCTION CAPABILITY INCLUDING VARIATIONAL GEOMETRICS FEATURE

DOCUMENTS INCORPORATED BY REFERENCE

U.S. Pat. No. 4,754,267, to common assignee, is hereby incorporated by reference.

BACKGROUND OF THE INVENTION

1. Field of the Invention

This invention relates to computer-aided drafting systems and particularly to storing sequences of system commands that can later be automatically retrieved and executed. It also relates particularly to automatically supplying parameters for drawings to maintain predetermined relationships between independent and dependent geometrics (entities in a drawing such as a cam, gear, lever, or the like).

2. Description of Related Art

The term "macro" is a short form for macroinstruction, a term from the computer programming art denoting a sequence of instructions for performing a predetermined function. In computer assembler programs, a macro can be defined and then inserted any place in the program by placing the name of the macro where the sequence of instructions is to be placed. This precludes having to write the sequence each time it is to be used, a useful feature where a function is to be performed many times. It reduces the possibility of errors and has the advantage over using subroutines of being faster because there is no need to call the subroutine, to supply any needed data, and to transfer back to the calling program.

In the CAD (computer-aided drafting) art, certain graphics (images) are supplied in libraries included with the program, especially for use in specialized fields. Often, however, the user has to supply unique graphics, symbols, icons, or the like that are not available in the library. Most systems supply the ability to design and to store user-designed graphics which can then be copied out of the library onto a drawing the same way as the prestored graphics.

Another way of enabling the user to supply his own graphics is to permit the user to store a macro to be called by the user when the graphic is needed. The graphic is designed by executing a series of commands supplied by the system manufacturer, for example, by combining standard shapes such as circles, boxes, and the like.

Present systems having the macro capability require the user to learn and to use a complicated macro language. This often leads to inefficient macros and the need for many corrections in the construction of the macro.

If a group of images depends on certain parameters to maintain a given relationship amongst the images, e.g., the ratio of a driven gear to a driving gear when the driving gear dimensions are supplied at execution time, the only way in the prior art to draw the images is for the user to do the calculations and supply the parameters for all the images each time the group is drawn.

In the prior art, U.S. Pat. No. 4,622,546 shows the use of macroinstructions for supplying display characters. Each character in a set of stored characters has an address that points to an associated macroinstruction and bit map. The macroinstructions contains executable instructions that establish the size and location of its corresponding bit map. There is no disclosure, however, of a method whereby a user can create a macroinstruction.

U.S. Pat. No. 4,439,761 teaches a technique for coupling a processor to a display device which is independently controlled. The source transmits instructions that describe a character to be displayed and the independent control in the display device interprets the received drawing instructions into a particular bit pattern tailored to the characteristics of the display device. The instructions are fixed and no method for permitting the user to create instructions is disclosed.

U.S. Pat. No. 4,710,885 discloses the use of a special tag in a procedural language that causes a graphic figure to be included on the output together with text.

U.S. Pat. No. 4,656,603 discloses the use of patterns or icons having a set of instructions associated therewith. A user can select and combine the icons to create more complicated icons. Icons and functions can be combined on a drawing.

None of these prior art patents, however, show or suggest the invention claimed herein.

SUMMARY OF THE INVENTION

In accordance with the invention, the x,y coordinates of a cursor in a graphics or CAD system are saved in response to a control signal while recording a macro. The x,y coordinates are checked to determine whether the cursor is positioned in a command area. If so, the command or a keyword associated therewith is stored in a macro list as well as being executed by the system. If not, they are converted to a parameter. In response to an end macro signal, the macro list is terminated. By a play macro signal, the commands and parameters stored in the macro list are retrieved and executed.

A special command can be used to suspend the recording of the commands and parameters so that, at execution time, the user can supply desired parameters.

Another special command can be used in conjunction with the suspend macro command to enter user-supplied prompts. The prompt command enables the user to enter a message on the screen or display device to supply an indication to the user when the macro is played back of the parameter that is to be entered.

An additional feature is a method for maintaining relationships among parts of a drawing (geometrics) in accordance with selectable parameters. For example, the drawing of a gear train can be recorded as a macro with defined relationships amongst the gears such as a ratio of diameters. The independent gear is drawn according to user-supplied parameters such as pitch diameter, outside diameter, and number of teeth. The parameters of the first dependent gear has a fixed relationship with respect to the independent gear, e.g., a gear ratio of one-half. A second dependent gear may have a fixed relationship with the first dependent gear, e.g., a gear ratio of one. When the macroinstruction is played to draw the gears, the user supplies the parameters for the independent gear and the other gears are drawn in accordance with the defined relationships.

The implementations of macros in the prior art have been complicated, requiring the user to learn a new computer language and its associated complex syntax. This invention improves the implementation of CAD macros so that CAD users can more easily and accurately use them without the need to learn a special language and syntax.

BRIEF DESCRIPTION OF THE DRAWING

The invention is described in detail by referring to the various figures which illustrate specific embodiments of the invention, and wherein like numerals refer to like elements.

FIG. 5 is an exemplary drawing of geometrics having fixed relationships that can be automatically drawn using the variational geometrics feature of the invention.

DESCRIPTION OF THE PREFERRED EMBODIMENT

In the following description, references are made to the flowcharts depicting the sequence of operations performed by the program. The symbols used therein are standard flowchart symbols accepted by the American National Standards Institute and the International Standards Organization. In the explanation, an operation may be described as being performed by a particular block in the flowchart. This is to be interpreted as meaning that the operations referred to are performed by programming and executing a sequence of instructions that produces the result said to be performed by the described block. The actual instructions used depend on the particular hardware used to implement the invention. Different processors have different instruction sets but the person of ordinary skill in the art is familiar with the instruction set with which he works and can implement the operations set forth in the blocks of the flowchart.

Certain operations are common to all programs such as those referred to as housekeeping. This includes operations like establishing constants, reserving memory space for variables, and supplying names to subroutines. Calling subroutines includes call and link procedures, i.e., establishing the address of the subroutine and supplying the parameters from the calling routine to the subroutine. These operations are sometimes accomplished using stacks, a section of memory which operates as a last-in-first-out (LIFO) buffer. When an address, operand, instruction, or the like is stored in the stack, the operation is called push. For example, when an operand is to be passed to a subroutine, it is pushed onto the stack, i.e., stored in the buffer. When the subroutine needs the parameter, it is read from the top of the stack by an operation called pop. Since these operations are well known in the art, no special explanations will be made except when necessary for a clear understanding of the invention.

Figure 1:
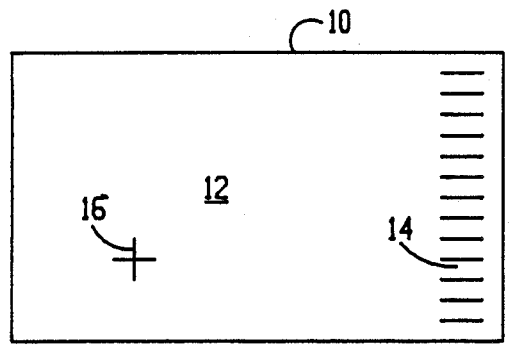
FIG. 1 is a representation of a display area as referred to in the explanation of the invention.

FIG. 1 shows a display area 12 having a boundary 10. A cursor 16 is moveable in the display area 12 by means of any number of positioning devices commercially available (not shown) such as a mouse, track ball, digital tablet, joy stick, or the cursor keys on a keyboard which is part of the graphics system. Positions on the display area 12 are denoted by x and y coordinates. The total number of x and y coordinate points depend on the display device used, common values being 200 to 350 y units and 640 x units.

Located within the display area 12 are command areas. In the example of FIG. 1, the commands are shown as a columnar list 14. To activate a command, the cursor 16 is positioned in the appropriate command area and a control signal is supplied, e.g., a button on the mouse or digital tablet pointer.

Figure 2:
FIG. 2 is a representation of a command area within the display area.

Each command area is designated a plurality of x,y positions. FIG. 2 illustrates the definition of a command area using two x and two y coordinates. The value of X1 defines the left side of the rectangular area assigned to the command area, and X2 defines the right side. The values of Y1 and Y2 define the top and bottom of the area, respectively. The selection of the command area is determined by ascertaining that the x coordinate is equal to or between the X1 and X2 values and the y coordinate is equal to or between the Y1 and Y2 values. This is within the skill of the art and needs no further explanation of the process of determining whether a command was selected by the control signal supplied by the user when the cursor is in a desired position. A technique for correlating a cursor position with a graphic entity is disclosed in U.S. Pat. No. 4,754,267 which is incorporated herein by reference, Shapes are made in the display area 12 (FIG. 1) by selecting commands and supplying the parameters used by the command. For example, if the command CIRCLE is selected, the user must next supply the parameters for drawing the circle such as the location of the center, the radius, the beginning and ending angles, and any desired rotation. The parameters may be supplied by the cursor in the case of the location of the center and the radius by positioning the cursor at the point in the area where the circle is to be centered and pressing the button that supplies a control signal signifying that the cursor is in the desired position. Next, the cursor is placed at some point on the circumference of the desired circle and the control signal supplied. If a full circle is desired, the other parameters are the default values of zero. (Parameters can also be entered from the keyboard by entering the values directly.) The terminal symbol 329 in FIG. 3 can be constructed by generating two semicircles, one with the beginning and ending angles of 90- and 270-degrees and the other with 270- and 90-degrees, respectively. Lines connecting the upper and lower end points can then be drawn using the cursor to select the command LINE and attaching each end of the lines to the corresponding end points of the semicircles.

It is often desirable to use the same pattern, i.e., combination of shapes, in many places in a drawing. One feature usually supplied with CAD programs is a library of commonly used shapes. Using a command such as COPY, a designated shape or pattern can be brought into an indicated position in the display area. If a desired shape that may be repeated several times is not available in the library, the program may supplied with the capability of storing user-generated library shapes or patterns. Although such library entries usually can be scaled when retrieved, the parameters are all scaled by the same amount.

It may be desirable to store a common shape or pattern with the capability of entering some or all of the parameters at the time the entity is copied into the existing drawing. For example, the drawing of a spring can be complicated and can be stored as a library symbol. Although the retrieved version can be scaled, it is more flexible to permit the various parameters of the spring, e.g., the wire size, diameter, and length, to be entered separately.

One approach to accomplishing the objectives of not having to reconstruct an oft used pattern while retaining flexible dimensioning is to provide the CAD system with the capability to store macroinstructions, more simply referred to as macros.

The implementations of macros in the prior art has been complicated, requiring the user to learn a new computer language and its associated complex syntax.

Figure 4:
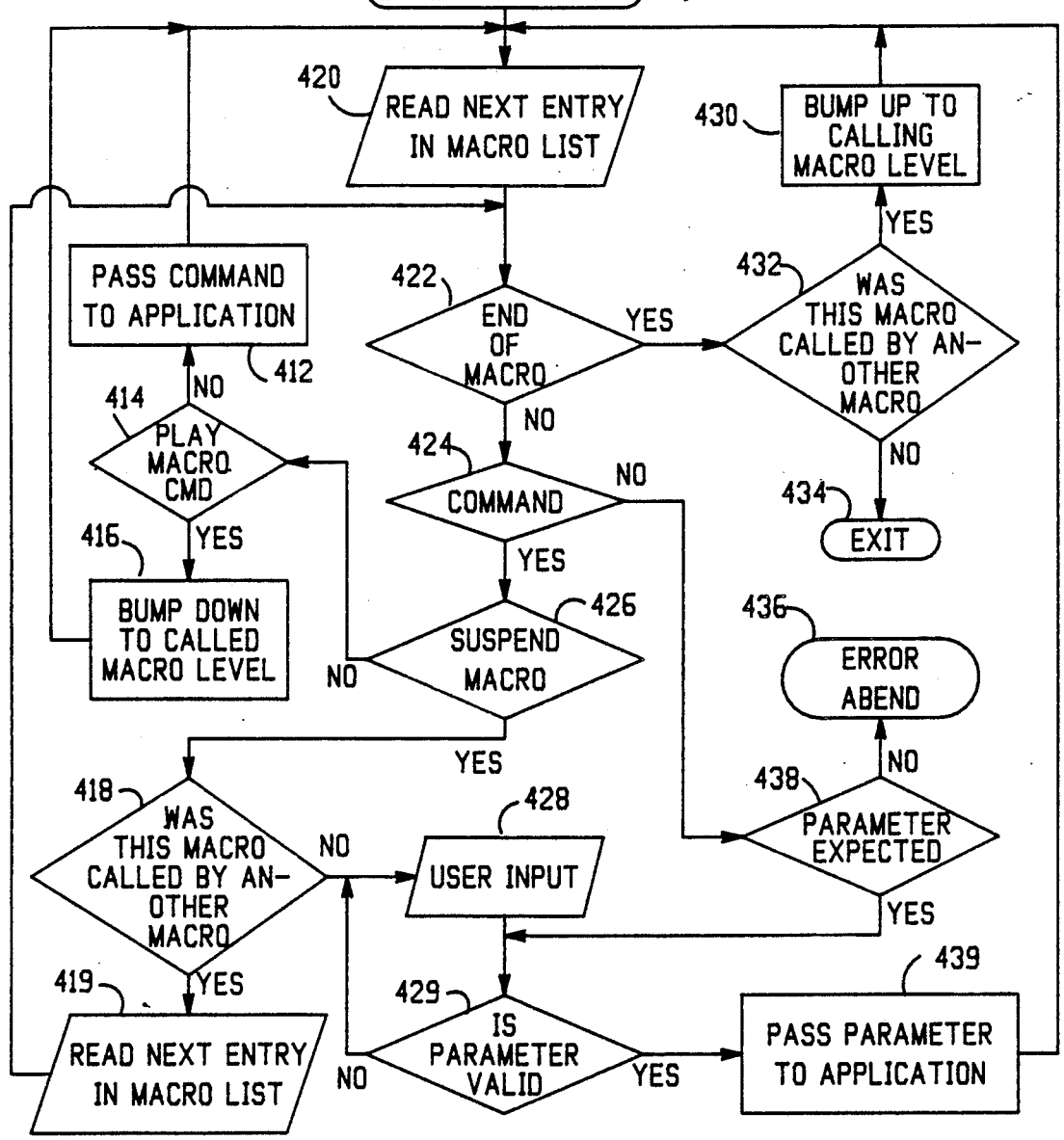
FIG. 4 is a flowchart of a play macro routine according to the invention.
Figure 3:
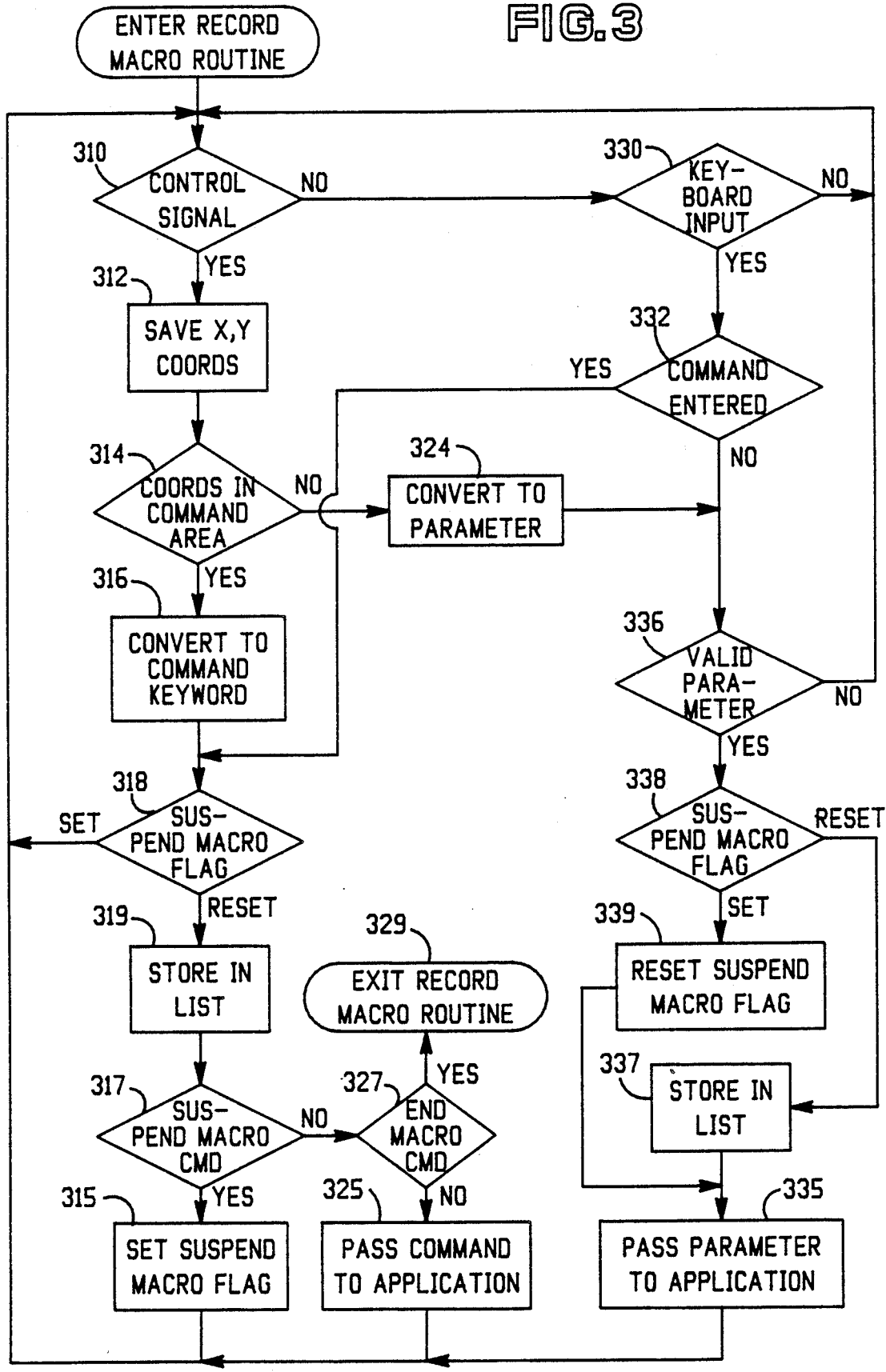
FIG. 3 is a flowchart of a record macro routine according to the invention.

FIGS. 3 and 4 are flowcharts of programs that can be used in CAD systems to supply the capability of storing user-generated macros without the necessity of learning a new language or syntax. In addition, the macros so generated can also use other macros which can themselves use other macros.

To use this capability, the operator selects commands RECORD MACRO, PLAY MACRO, END MACRO, MACRO PROMPT, and SUSPEND MACRO from the proper command areas at the proper times. To begin recording the macro, the user selects RECORD MACRO or other suitable name denoting the process to take place. This causes the program in the flowchart of FIG. 3 to be entered.

First, the routine checks at a decision block 310 to determine whether a control signal has been supplied. If not, then at a decision block 330, it checks whether a keyboard entry has been made. If not, the check at the decision block 310 is made again. At the speed the computer executes such operations in comparison with the actions of the user, the loop just described will be traversed many thousands of times waiting for either a control signal or a keyboard entry.

When a control signal has been supplied, the program moves from the decision block 310 to a process block 312 which saves the x,y coordinates of the cursor. The exact way of performing this action depends on the processor and hardware being used, and its implementation is well within the skill of the art.

After the x,y coordinates are saved, they are checked in a decision block 314 to determine whether they are within a command area. If so, the selected command is converted to a keyword in a process block 316. The keyword, which can be the command word per se, uniquely identifies the action to be performed. Next, as shown in a decision block 318, a flag is checked to determine whether the SUSPEND MACRO flag is set. If so, the entry is not stored in the macro list and the program branches back to the check for control signal in the decision block 310.

As the macro is being recorded, the commands are being executed as entered with the parameters entered by the user. Such concurrent operations of several routines are common and are sometimes referred to as timesharing or parallel operations. Even though, operations are not executed simultaneously, switching back and forth between operations at appropriate times is so fast as to seem to the human observer to be simultaneous. Microprocessors such as the 80286 commercially available from Intel Corporation have special instructions for performing task switching. The program which is executing the commands concurrent with the store macro operation is referred to as the application.

The SUSPEND MACRO and END MACRO commands are treated the same as any other command by the record macro routine.

If the suspend macro flag is reset, then the command is stored in the macro list as indicated by a process block 319. If the command was a SUSPEND MACRO command as determined in the decision block 317, the suspend macro flag is set by a process block 315 and the program branches to the decision block 310. If the command stored was not a SUSPEND MACRO command, then the command is checked at a decision block 327 to determine whether it was an END MACRO command. If it was an END MACRO command, the record macro routine is exited as indicated by the terminal block 329. The END MACRO command can be stored in the list as a unique symbol. The macro can then be stored as a file at a location identified by the name the user gives the macro for later retrieval and execution. If not an END MACRO command, the command is passed to the application for execution and the routine returns to the decision block 310.

The MACRO PROMPT command can be used preceding the SUSPEND MACRO command if the user desires to have a message displayed at execution time to supply a cue as to which parameter is expected. This feature makes the macro more easily usable by users, especially those who did not record it.

If a keyboard entry is made as determined by the decision block 330, then a determination is made by a decision block 332 whether the entry was a command. If so, then the program continues at the decision block 312 and proceeds as described above.

If the keyboard entry was not a command, then the program continues at a decision block 336 which determines whether the entry was a valid parameter. The same point is reached when the control signal caused x,y coordinates to be saved which did not correspond to a command area. The x,y coordinates in such a case are converted to parameters in a process block 324. Such conversion depends on the parameter expected. For example, if a CIRCLE command was previously entered, the parameters are the location of the center, the x,y coordinates per se. The next entry would be the radius which would be converted with the well known Pythagorean formula, $$sqr((xc-xr)*(xc-xr)+(yc-yr)*(yc-yr))$$

where
- $xc$ = selected x coordinate for center,
- $xr$ = selected x coordinate for the radius,
- $yc$ = selected y coordinate for center,
- $yr$ = selected y coordinate for the radius, and
- sqr indicates the square root of the resulting value is to be extracted.

If the parameter is valid, then a check is made of the suspend macro flag in a decision block 338. If set, it is reset by a process block 339 and the parameter is passed to the application as indicated by a process block 335. If the suspend macro flag is reset, then the parameter is stored in the macro list according to a process block 337 and the parameter passed to the application as described above.

If the parameter is not valid as determined by the decision block 336, the routine returns to the decision block 310, usually causing the application to request the same parameter again.

Another macro can be executed during this process if the PLAY MACRO command is selected. The command is stored and the PLAY MACRO activated for the application.

When the stored macro is desired for replay, the PLAY MACRO command is selected and the name of the macro will be the parameter requested. When entered, the name is converted to a memory location or used to retrieve the file from an external device, and the entries in the macro list are read out and executed according to the process of the flowchart in FIG. 4.

The PLAY MACRO routine in FIG. 4 begins by reading the first (next) entry in the macro list that is being repeated as shown in an input/output block 420. If the command read from the list is the END MACRO command as determined in a decision block 422, the routine checks in a decision block 432 to determine whether the macro being executed was called by another macro. If so, then according to a process block 430, the level is bumped up to the level of the macro command that called the macro. Since the routine continues in the same manner no matter which level is being executed, the next entry in the proper macro list is read by the input/output block 420.

Going from one level to another can be simply accomplished by using a level stack. When called, the address of the called macro is pushed onto the level stack and retrieved to get the address of the next entry in the macro list. (Each time it is retrieved, it is incremented but remains at the top of the stack.) If the macro being executed calls another macro, the address of the latter is pushed onto the level stack. When this is done, it is referred to as bumping down to the called macro level. When an END MACRO command is executed and the terminating macro was called by another macro, the address on the level stack is popped and execution continues in the calling macro. This process is referred to as bumping up to the calling macro level.

If, at the decision block 432, the terminating macro was not called by another macro, then the routine is exited at a terminal block 434.

If, at the decision block 422, the command is not an END MACRO command, then it is tested to determine whether it is a command at a decision block 424. If it is not a command, a check at a decision block 438 is made to determine whether a parameter is expected. If not, then at a terminal 436 an abnormal end is executed since this indicates an error condition. If a parameter is expected, a check is made at a decision block 429 to determine whether the parameter is valid.

If the parameter is valid, then it is passed to the application by a process block 439. If the parameter is not valid, the routine waits for a user input signified by an input/output block 428. The input, when supplied, is checked by the decision block 429 and the previously described action is executed.

If, at the decision block 424, the entry read from the macro list was a command, a check is made at a decision block 426 to determine whether it is a SUSPEND MACRO command. If not, then a check is made at a decision block 414 to determine whether it is a PLAY MACRO command.

If not a PLAY MACRO command, then by a process block 412 the command is passed to the application. If it is a PLAY MACRO command, then according to a process block 416, the level is bumped down to the called macro level. In either case, the next entry is read from the appropriate macro list.

If it were determined at the decision block 426 that the command was a SUSPEND MACRO command, then a check is made at a decision block 418 to determine whether the present macro was called by another macro. If so, the next entry is the macro list is read from the calling macro list (by using its address which was pushed on the level stack). The entry is then checked by the end-of-macro decision block 422 as previously described with the same ensuing processes.

If the command were a SUSPEND MACRO command but the macro being executed was not called by another macro, the routine requests user input at the input/output block 428. A prompt message is displayed to cue the user as to which parameter is to be entered if the MACRO PROMPT command had been utilized while recording the macro.

From the process described above, it is clear that using the teachings of this invention, a user of a graphics system can supply or create unique macros and decide through the implementation of the suspend macro instruction whether to use fixed parameters entered during the record macro process or to enter parameters at execution time. Furthermore, the user can use other macros in the system within the user's macro if desirable. This is all accomplished without having to learn another programming language or its syntax, but the macro can be of any complexity necessary to accomplish its purpose.

This arrangement permits incorporation of the ability to create drawings of figures having entities that are interrelated to one another. There are many occasions in making drawings where there is a need to maintain interrelationships amongst the parts of the drawing. This parts are also referred to as geometrics, a term which encompasses a given figure such as a cam, a spring, a gear, or the like including its dimensions. An example of a group of geometrics that incorporate fixed interrelationships is a gear train where the ratio of the gears' pitch diameters are fixed and the parameters of the first gear are supplied at the time the drawing is generated.

FIG. 5 shows a relationship amongst three gears 511, 521, and 531 shown as circles representing the pitch diameters. The gear 521 has a diameter half that of the gear 511 and the gear 531 has the same diameter as the gear 521. The y coordinates of the gears 521 and 531 are the same as the y coordinate of the gear 511. The x,y coordinates of the gear 511 and its radius are supplied as parameters when the macro to which the geometric group belongs is played back to make the drawing.

The calculations of the dependent parameters, e.g., the location of the centers and radii of the circles 521 and 531 in the illustrative example of FIG. 5, can be implemented using the stack previously referred to or using a special calculation stack or by using a pop-up calculator which is a feature of many CAD systems. The latter approach will be used in the following detailed description for the creation of the geometrics in FIG. 5.

The command that causes the calculator to be displayed is CALC-ON and is stored the same as the other commands in the macro. The entry into the calculator is the parameter following a CALC instruction. Entries can be made using the cursor to select the "keys" of the displayed calculator. When a drawing command is expecting a parameter, the calculator can be used to calculate the parameter and then supplied to the application program using an ENTER parameter, i.e., the CALC ENTER pair causes the contents of the calculator's x and y result registers to be supplied as the parameter the application program is expecting.

Another command to implement the variational geometry feature is MEASURE which processes the x,y coordinates of its parameters, supplied by the user—commonly with the cursor—to determine and to display the values of the selected x,y coordinates and the distances from previously selected x,y coordinates such as dx, dy, dd, and the angle from the horizontal to the line connecting the last two selected points. (dd is the true distance between the points, dx, the horizontal distance, and dy, the vertical.) These values can be entered into the calculator by selecting their location in the display in the same manner as the selection of a command area. The displayed calculator is operated in the same manner. A useful adjunct to the selection of command areas or displayed points or shapes is to highlight the selected command or point or shape as the cursor's position is in its area. The details for implementing this is shown in U.S. Pat. No. 4,754,267, incorporated herein by reference.

When a command requires a point to be selected while recording a macro, the points selected during playback are made in the same order by the macro as they were during recording if suspend macro was not active. This can also be done as a stack operation by pushing onto the stack the x,y coordinates of the points used. If, for example, the MEASUR command is invoked and two points are selected, the macro will select the same two points although the x,y coordinates may not be the same during the playback.

In the following example, the commands and parameters are listed to the left and the comments delimited by / explain the action of the commands. The calculations described below use in-fix notation as opposed to Polish or Reverse-Polish notation. The following sequence is stored after the RECORD MACRO instruction is selected.

| | |
|---|---|
| PROMPT: | /stores literal string for display/ |
| User enters: "SELECT CENTER OF FIRST GEAR" | |
| POINT | /center point of the first gear/ |
| (User positions cursor at desired point or enters x,y coordinates via keyboard.) | |
| ARC | /used to make a circle/ |
| CENTER-BASED | |
| ATTACH | /center is to be selected point/ |
| (User moves the cursor to the point entered as the center of the first circle and generates the control signal or enters value via keyboard.) | |
| PROMPT: | |
| User enters: " Enter first gear radius " | |
| SUSPEND-MACRO | /waits for and does not record parameter/ |
| (When the radius parameter is entered, the circle is constructed.) | |
| MEASUR | |
| (User selects center point 503 of the circle and a point 513 on the circumference.) | |
| CALC-ON | /brings up the calculator/ |
| X= | /the x coordinate of the last point 513 is selected by the user and automatically entered into the calculator/ |
| CALC STORE | |
| CALC 0 | /the x coordinate of the point 513 is stored in register 0 of the calculator/ |
| Y= | |
| CALC STORE | |
| CALC 1 | /the y coordinate is stored in register 1/ |
| DX= | |
| CALC STORE | |
| CALC 2 | /the radius is stored in register 2/ |
| CALC ÷ | |
| CALC 2 | |
| CALC = | |
| CALC STORE | |
| CALC 3 | /half the radius of the first circle 511, i.e., the radii of circles 521 and 531, are stored in register 3/ |
| CALC RCL | |
| CALC 0 | /recalls register 0 contents/ |
| CALC + | |
| CALC RCL | |
| CALC 3 | /add radius from register 3/ |
| CALC = | |
| CALC STORE | |
| CALC 4 | /the x coordinate of the center POINT 523 of the circle 521 is calculated and stored in register 4 of the calculator/ |
| CALC RCL | |
| CALC 1 | |
| CALC X_TO_Y | /the y coordinate is read from register 1 and moved from the x result (displayed) register to the y auxiliary register/ |
| CALC RCL | |
| CALC 4 | /the x coordinate of the circle 521 is recalled to the x register/ |
| POINT | /this selects the center point for a circle/ |
| CALC ENTER | /the x and y registers supply the x and y parameters for the POINT command. It also causes the calculator to discontinue display/ |
| ARC | |
| CENTERED-BASED | |
| ATTACH | |
| (User places cursor to select point just created.) | |
| CALC-ON | |
| CALC 0 | |
| CALC X-TO-Y | /clear the y register/ |
| CALC RCL | |
| CALC 3 | |
| CALC ENTER | /supplies the radius to the application/ |
| MEASUR | |
| (User selects the points 523 and 525.) | |
| CALC-ON | |
| X= | |
| CALC STORE | |
| CALC 5 | /the x coordinate of the point 525 is stored in register 5 of the calculator/ |
| CALC + | |
| CALC RCL | |
| CALC 3 | |
| CALC = | |
| CALC STORE | |
| CALC 6 | /the x coordinate of the center 533 of the circle 531 is calculated and stored in register 6/ |
| CALC RCL | |
| CALC 1 | |
| CALC X-TO-Y | /y register is set with the same y value/ |
| CALC RCL | |
| CALC 6 | /x coordinate from register 6 retrieved/ |
| POINT | |
| CALC ENTER | /x,y coordinates of the point 533 is supplied/ |
| ARC | |
| CENTER-BASED | |
| ATTACH | |
| CALC-ON | |
| CALC 0 | |
| CALC X-TO-Y | /clear the y register/ |
| CALC RCL | |
| CALC 3 | |
| CALC ENTER | /radius is supplied for the gear 531/ |
| READOUT OFF | /turns off measurement display/ |
| END MACRO | /signals macro is finished/ |

The same operations could be implemented by storing the commands and operands on a stack using Polish notation. In such an implementation, the top of the stack can be considered the x register and the second stack value, the y register which are supplied to the application program as the x and y parameters.

While the invention has been particularly shown and described with reference to a preferred embodiment thereof, it will be understood by those skilled in the art that various changes and modifications in form and details may be made therein without departing from the spirit and scope of the invention according to the following claims.

What is claimed is:

1. A method in a system for creating graphics, said system including means for displaying a work area having positions thereon identified by x,y coordinates, means for positioning a cursor within the work area, means for displaying commands within command areas in said work area wherein each command area is associated with a unique command, means for supplying a control signal, and processor means for executing commands, comprising the steps of:

maintaining, in response to a first command, a list of selected commands comprising the steps of saving the x,y coordinates of the location of said cursor in response to the control signal, determining whether the saved x,y coordinates are within a command area, and storing sequentially in said list a code word uniquely identifying the command corresponding to a determined command area;

marking, in response to a second command, the end of the list;

executing, in response to a third command, the listed sequence of selected commands comprising the steps of retrieving in sequence each entry from said list, and passing each retrieved entry to the processor means for execution; and terminating said executing steps when the retrieved entry marks the end of the list.

2. The method as claimed in claim 1 in said maintaining step the further step comprising:

converting the saved x,y coordinates to appropriate parameters if said coordinates are not within a command area and wherein said storing step includes storing said appropriate parameters in said list.

3. The method claimed in claim 2 further including in the maintaining steps, suspending, in response to a fourth command, said maintaining steps until a parameter has been entered into the system.

4. The method claimed in claim 3 further including in the executing steps, supplying a prompting message when a parameter entry is expected.

5. The invention as claimed in claim 1 including in the executing steps, the further step comprising:

bumping to a macro level in response to a stored bumping command to execute a different list of commands.

6. The invention as claimed in claim 5 including in the executing steps, the further step comprising:

bumping to a calling macro level in response to an entry in a called macro level indicating the end of said called macro level.

7. The invention as claimed in claim 1 including in said maintaining steps, the additional steps comprising:

accepting input data from a keyboard;

placing data accepted from the keyboard in said list; and storing data from said keyboard as parameters if the input data from the keyboard is not a command.

8. The invention as claimed in claim 1 including in said maintaining steps, the additional steps comprising:

ascertaining parameter values corresponding to the x,y coordinates if said saved x,y coordinates do not correspond to a command area; and inserting into said list the parameters corresponding to the saved x,y coordinates.

* * * * *